US009496400B1

(12) United States Patent
Balakrishnan et al.

(10) Patent No.: US 9,496,400 B1
(45) Date of Patent: Nov. 15, 2016

(54) FINFET WITH STACKED FACETED S/D EPITAXY FOR IMPROVED CONTACT RESISTANCE

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/983,057

(22) Filed: Dec. 29, 2015

(51) Int. Cl.
*H01L 29/78* (2006.01)
*H01L 29/06* (2006.01)
*H01L 29/66* (2006.01)
*H01L 21/306* (2006.01)
*H01L 21/311* (2006.01)

(52) U.S. Cl.
CPC ....... *H01L 29/785* (2013.01); *H01L 21/30604* (2013.01); *H01L 21/31111* (2013.01); *H01L 29/0649* (2013.01); *H01L 29/6656* (2013.01); *H01L 29/66795* (2013.01)

(58) Field of Classification Search
CPC ........... H01L 29/785; H01L 29/66795; H01L 27/0886
See application file for complete search history.

(56) References Cited

U.S. PATENT DOCUMENTS

| 6,413,802 | B1* | 7/2002 | Hu | H01L 21/845 257/E21.703 |
|---|---|---|---|---|
| 8,338,260 | B2 | 12/2012 | Cheng et al. | |
| 8,680,628 | B2 | 3/2014 | Doris et al. | |
| 8,890,245 | B2 | 11/2014 | Cheng et al. | |
| 8,933,515 | B2 | 1/2015 | Bedell et al. | |
| 2011/0210404 | A1* | 9/2011 | Su | H01L 29/785 257/401 |
| 2013/0270611 | A1 | 10/2013 | Adam et al. | |
| 2014/0145270 | A1 | 5/2014 | Cheng et al. | |
| 2014/0145271 | A1 | 5/2014 | Cheng et al. | |
| 2015/0162415 | A1 | 6/2015 | Yin et al. | |

* cited by examiner

*Primary Examiner* — Tucker J Wright
(74) *Attorney, Agent, or Firm* — Scully, Scott, Murphy & Presser, P.C.; Louis J. Percello, Esq.

(57) ABSTRACT

A semiconductor structure including a multi-faceted epitaxial semiconductor structure within both a source region and a drain region and on exposed surfaces of a semiconductor fin is provided. The multi-faceted epitaxial semiconductor structure includes faceted epitaxial semiconductor material portions located on different portions of each vertical sidewall of the semiconductor fin and a topmost faceted epitaxial semiconductor material portion that is located on an exposed topmost horizontal surface of the semiconductor fin. The multi-faceted epitaxial semiconductor structure has increased surface area and thus an improvement in contact resistance can be obtained utilizing the same.

20 Claims, 11 Drawing Sheets

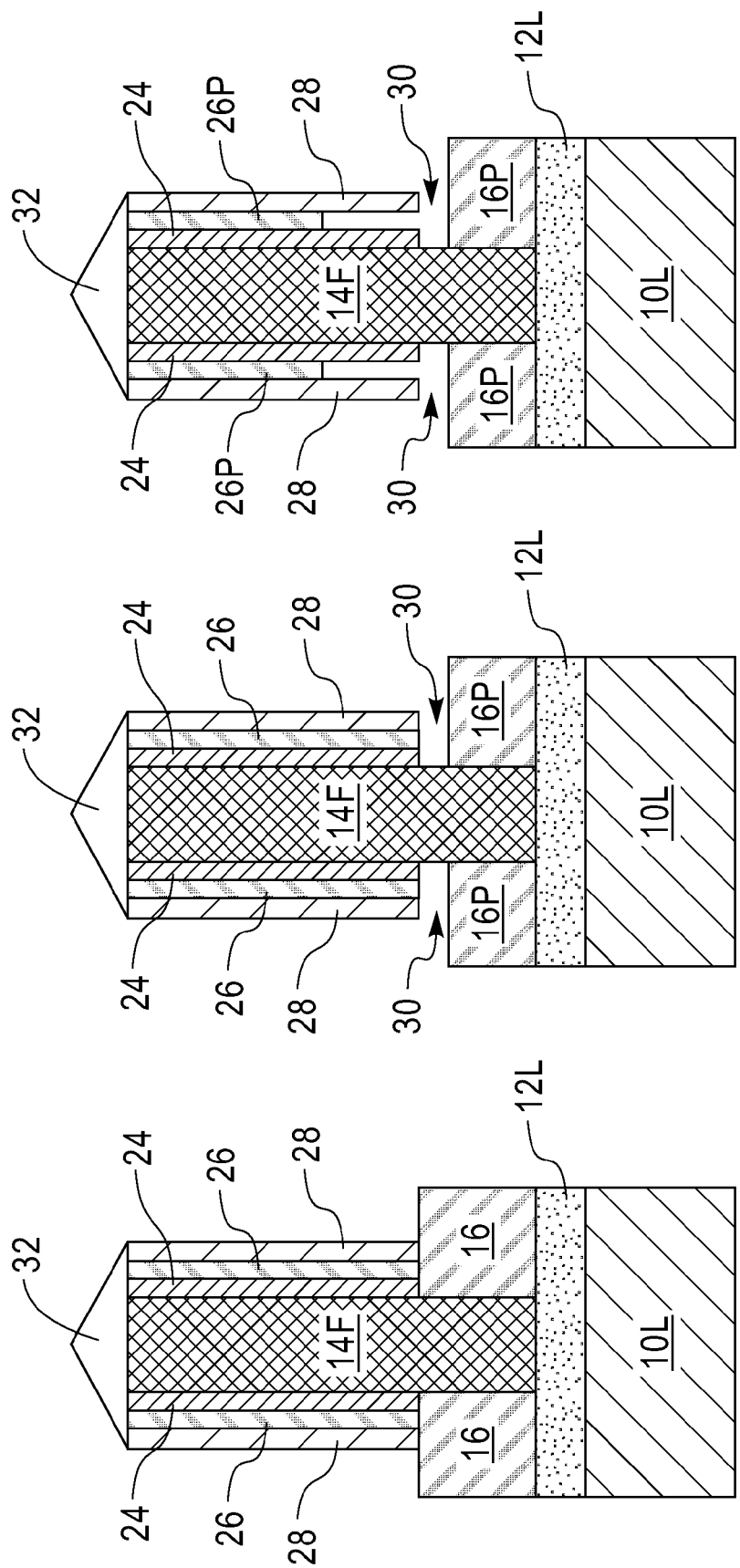

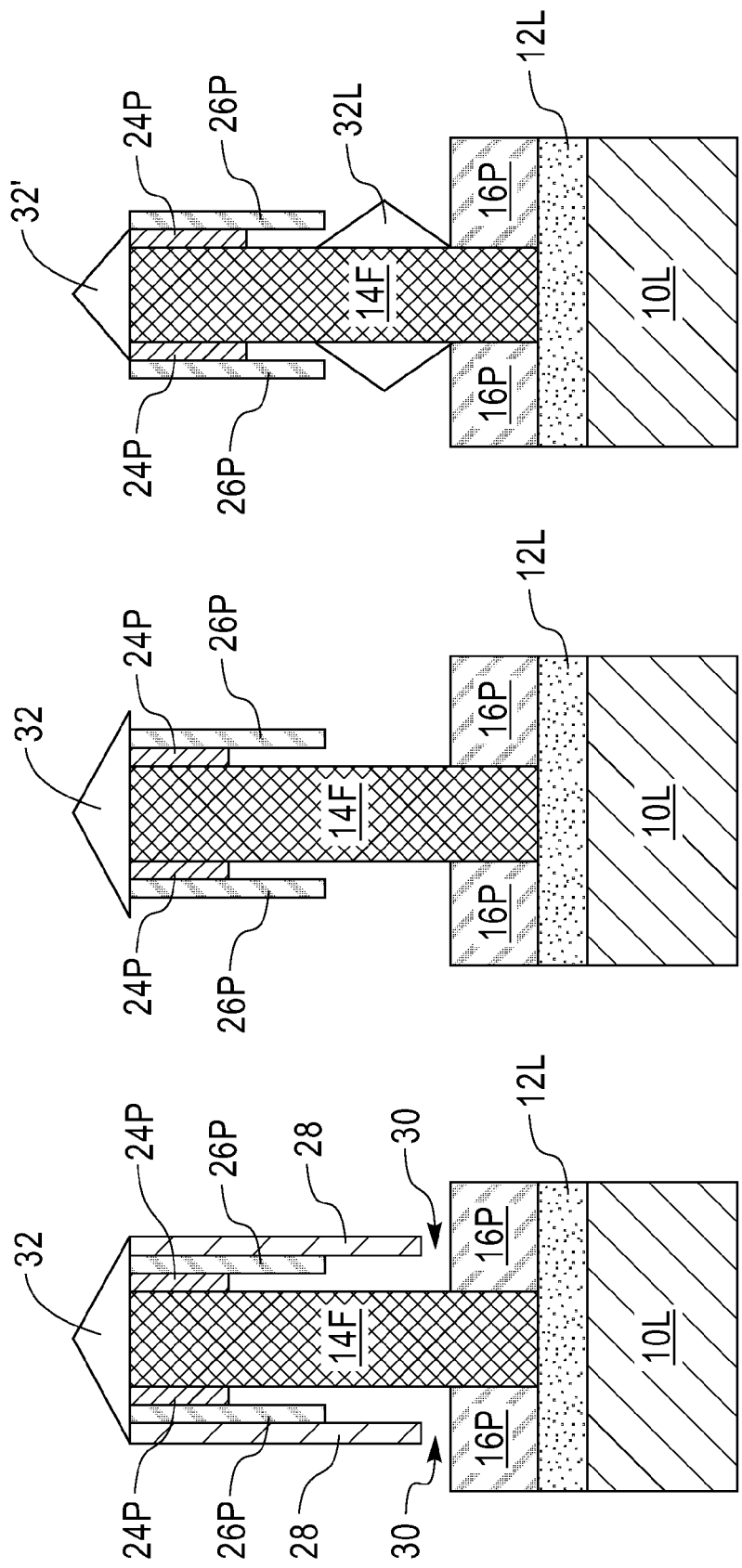

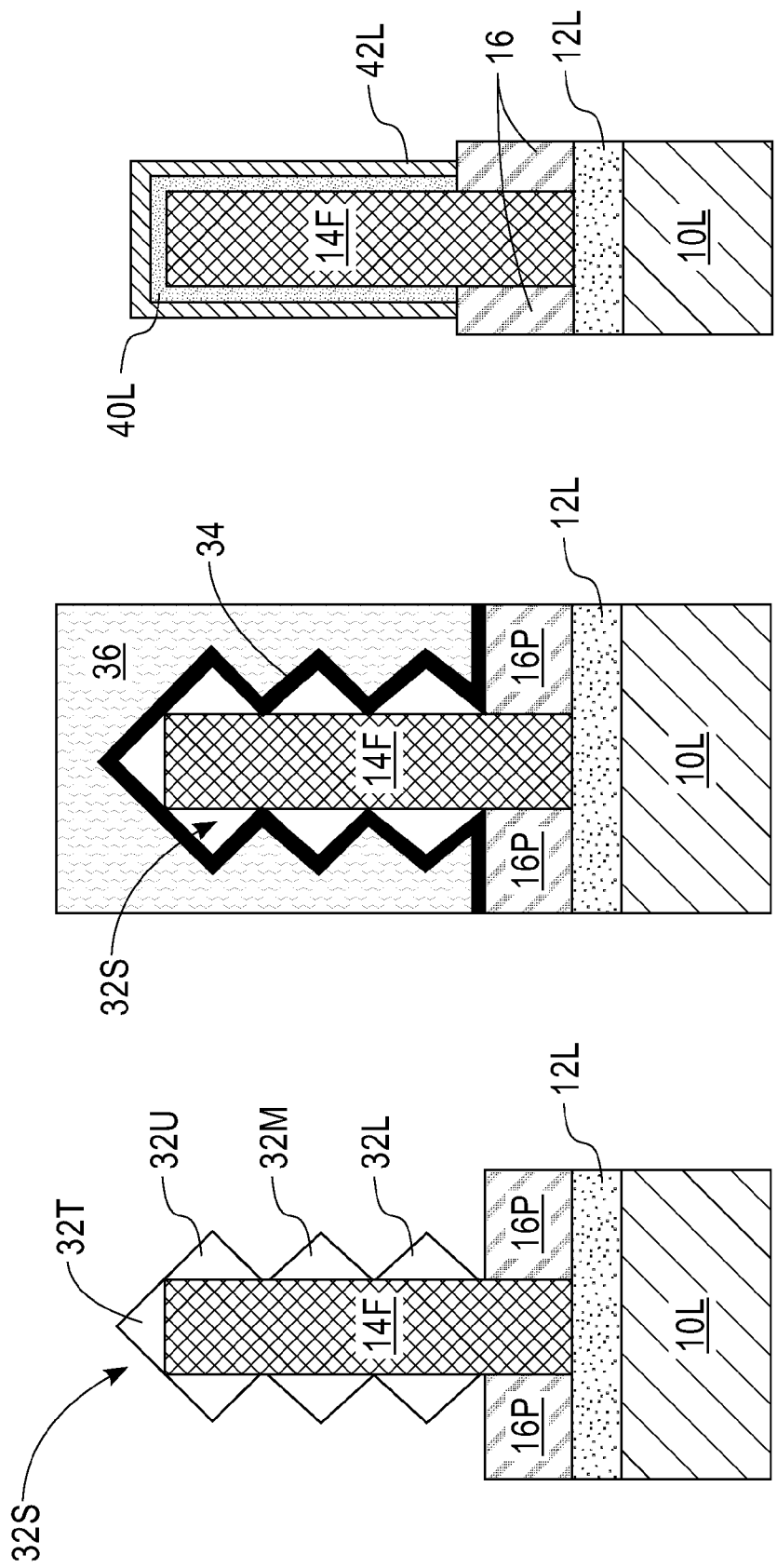

FINFET WITH STACKED FACETED S/D EPITAXY FOR IMPROVED CONTACT RESISTANCE

BACKGROUND

The present application relates to semiconductor technology. More particularly, the present application relates to a semiconductor structure including a multi-faceted epitaxial semiconductor structure within both a source region and a drain region and on exposed surfaces of a semiconductor fin. The present application also relates to a method of forming the semiconductor structure of the present application.

The use of non-planar semiconductor devices such as, for example, fin field effect transistors (FinFETs) is the next step in the evolution of complementary metal oxide semiconductor (CMOS) devices. Fin field effect transistors (FinFETs) can achieve higher drive currents with increasingly smaller dimensions as compared to conventional planar FETs.

In typically FinFET devices, an epitaxial semiconductor material structure having a faceted surface is grown from the exposed surfaces of each semiconductor fin and merging of the individual epitaxial semiconductor material structures generally occurs. In such instances, the contact structures can only be formed on the exposed topmost horizontal surface of the merged epitaxial semiconductor material structures. As such, the contact resistance and spreading resistance of conventional FinFET devices is very high. A method is thus needed that can reduce the contact resistance and spreading resistance of FinFET devices.

SUMMARY

A semiconductor structure including a multi-faceted epitaxial semiconductor structure within both a source region and a drain region and on exposed surfaces of a semiconductor fin is provided. The multi-faceted epitaxial semiconductor structure includes faceted epitaxial semiconductor material portions located on different portions of each vertical sidewall of the semiconductor fin and a topmost faceted epitaxial semiconductor material portion that is located on an exposed topmost horizontal surface of the semiconductor fin. The multi-faceted epitaxial semiconductor structure has increased surface area and thus an improvement in contact resistance can be obtained utilizing the same.

In one aspect of the present application, a semiconductor structure is provided. In one embodiment of the present application, the semiconductor structure may include at least one semiconductor fin extending upwards from a surface of a substrate, and a functional gate structure straddles over a portion of the at least one semiconductor fin. A multi-faceted epitaxial semiconductor structure is located on exposed surfaces of the at least one semiconductor fin and on both sides of the gate structure. Each multi-faceted epitaxial semiconductor structure includes a plurality of faceted epitaxial semiconductor material portions located on different portions of each vertical sidewall of the at least one semiconductor fin and a topmost faceted epitaxial semiconductor material portion that is located on an exposed topmost horizontal surface of the at least one semiconductor fin.

In another aspect of the present application, a method of forming the above mentioned semiconductor structure is provided. In one embodiment, the method may include forming a gate structure straddling over a portion of at least one semiconductor fin. Next, a multi-faceted epitaxial semiconductor structure is formed on exposed surfaces of the at least one semiconductor fin and on both sides of the gate structure, wherein each multi-faceted epitaxial semiconductor structure includes a plurality of faceted epitaxial semiconductor material portions located on different portions of each vertical sidewall of the at least one semiconductor fin and a topmost faceted epitaxial semiconductor material portion that is located on an exposed topmost horizontal surface of the at least one semiconductor fin.

BRIEF DESCRIPTION OF SEVERAL VIEWS OF THE DRAWINGS

FIG. 6 is a cross sectional view of the exemplary semiconductor structure of FIG. 5 after forming a topmost precursor faceted epitaxial semiconductor material portion on the exposed topmost horizontal surface of the at least one semiconductor fin.

FIG. 7 is a cross sectional view of the exemplary semiconductor structure of FIG. 6 after recessing the local isolation structure to provide a gap beneath the multilayered spacer structure that exposes a portion of the at least one semiconductor fin.

FIG. 8 is a cross sectional view of the exemplary semiconductor structure of FIG. 7 after selectively etching a second spacer layer of the multilayered spacer structure relative to the first spacer layer and the third spacer layer.

FIG. 9 is a cross sectional view of the exemplary semiconductor structure of FIG. 8 after selectively etching the first spacer layer of the multilayered spacer structure relative to a remaining portion of the second spacer layer and the third spacer layer.

FIG. 10 is a cross sectional view of the exemplary semiconductor structure of FIG. 9 after selectively etching an entirety of the third spacer layer of the multilayered spacer structure relative to a remaining portion of the first spacer layer and the remaining portion of the second spacer layer.

FIG. 11 is a cross sectional view of the exemplary semiconductor structure of FIG. 10 after epitaxial growth of a lower faceted epitaxial semiconductor material portion on an exposed lower portion of each vertical sidewall of the at least one semiconductor fin.

FIG. 15 is a cross sectional view of the exemplary semiconductor structure of FIG. 14 after epitaxial growth of an upper faceted epitaxial semiconductor material portion on an exposed upper portion of each vertical sidewall of the at least one semiconductor fin.

FIG. 16 is a cross sectional view of the exemplary semiconductor structure of FIG. 15 after forming a metal semiconductor alloy layer on exposed surfaces of the multi-faceted epitaxial semiconductor material which includes the lower faceted epitaxial semiconductor material portion, the middle faceted epitaxial semiconductor material portion, the upper faceted epitaxial semiconductor material portion and the topmost faceted epitaxial semiconductor material portion, and a contact metal on the metal semiconductor alloy.

FIG. 17 is a cross sectional view of the exemplary semiconductor structure of FIG. 4C after forming a multilayered liner structure straddling the exposed portions of each vertical sidewall and a topmost horizontal surface of the at least one semiconductor fin in accordance with an embodiment of the present application.

DETAILED DESCRIPTION

Figure 1A:
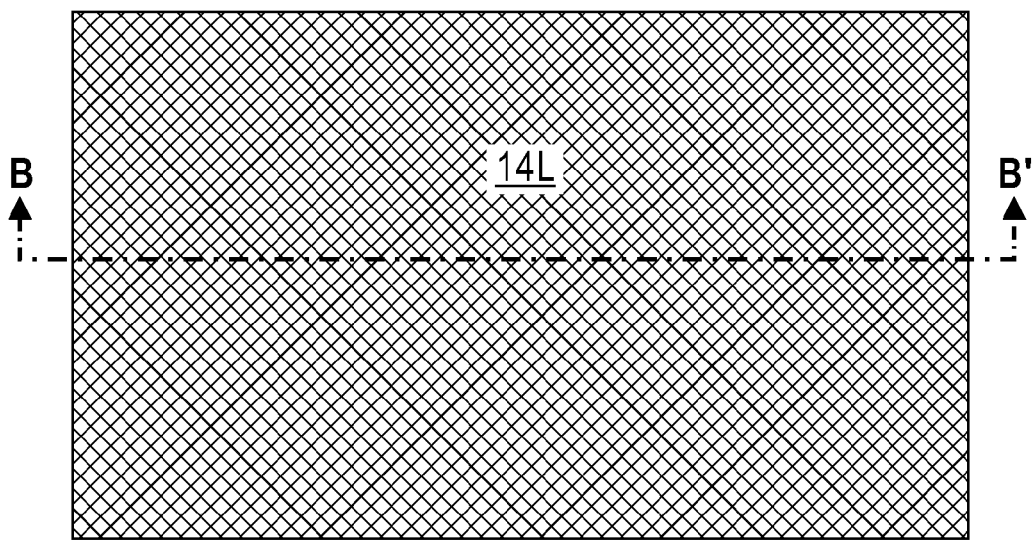
FIG. 1A is a top down view of an exemplary semiconductor structure including, from bottom to top, a handle substrate, an insulator layer and a semiconductor material layer that can be employed in one embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1B:
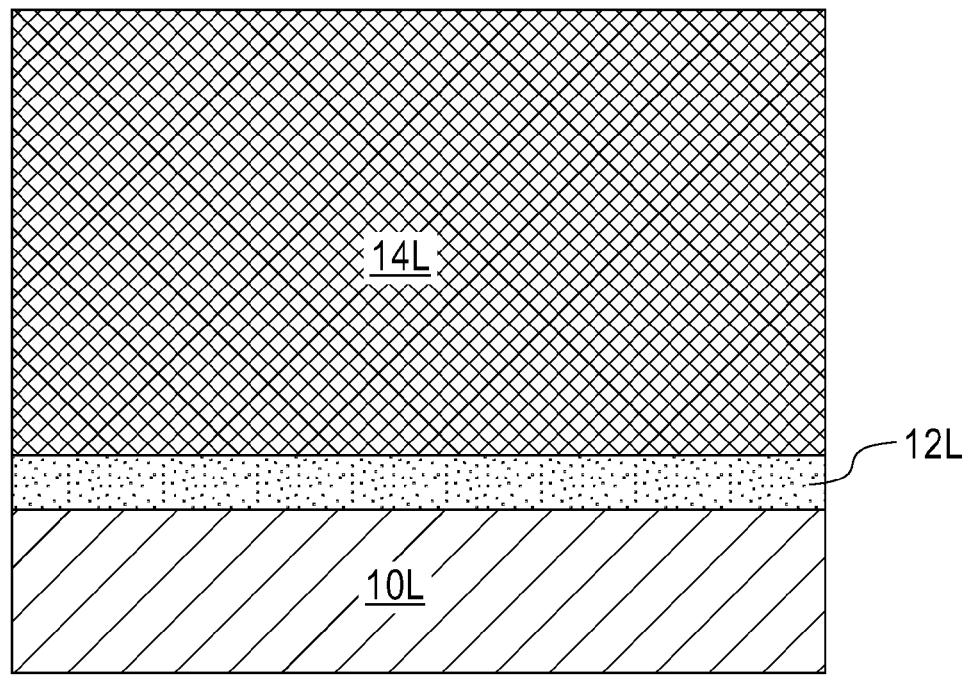
FIG. 1B is a cross sectional view of the exemplary semiconductor structure of FIG. 1A along vertical plane B-B'.

Referring first to FIGS. 1A-1B, there are illustrated various views of an exemplary semiconductor structure that can be employed in accordance with an embodiment of the present application. In the illustrated embodiment, the exemplary semiconductor structure may include, from bottom to top, a handle substrate 10L, an insulator layer 12L and a semiconductor material layer 14L. Collectively, the exemplary semiconductor structure including the handle substrate 10L, the insulator layer 12L and the semiconductor material layer 14L may be referred to herein as a semiconductor-on-insulator (SOI) substrate. In some embodiments, a bulk semiconductor substrate (not shown, but can be deduced by one skilled in the art) can be used instead of the SOI substrate shown in FIGS. 1A-1B. By "bulk" it is meant that the entirety of the substrate is composed of at least one semiconductor material.

In one embodiment, the handle substrate 10L may include at least one semiconductor material that has semiconducting properties. Examples of materials that have semiconducting properties and thus can be employed as the semiconductor material that provides the handle substrate 10L include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one embodiment, the handle substrate 10L is composed entirely of silicon.

In another embodiment of the present application, the handle substrate 10L may be composed of a non-semiconductor material including, for example, a dielectric material and/or a conductive material.

When the handle substrate 10L is composed of at least one semiconductor material, the at least one semiconductor material that provides the handle substrate 10L may be single crystalline, polycrystalline or amorphous. In one example, the handle substrate 10L is composed of single crystalline silicon.

When the handle substrate 10L is composed of at least one semiconductor material, the at least one semiconductor material that provides the handle substrate 10L may have any of the well known crystal orientations. For example, the crystal orientation of the handle substrate 10L may be {100}, {110}, or {111}. Other crystallographic orientations besides those specifically mentioned can also be used in the present application.

The insulator layer 12L of the exemplary semiconductor structure shown in FIG. 1 may be a crystalline or non-crystalline dielectric material such as an oxide and/or nitride. In one embodiment, the insulator layer 12L is a dielectric oxide such as, for example, silicon dioxide. In another embodiment of the present application, the insulator layer 12L may be a dielectric nitride such as, for example, silicon nitride or boron nitride. In yet another embodiment of the present application, the insulator layer 12L may include a stack of a dielectric oxide and a dielectric nitride. In one example, a stack of, in any order, silicon dioxide and silicon nitride or boron nitride may be employed as the insulator layer 12L. The insulator layer 12L may have a thickness from 10 nm to 200 nm, although other thicknesses that are lesser than, or greater than, the aforementioned thickness range may also be employed as the thickness of the insulator layer 12L.

The semiconductor material layer 14L may include one of the semiconductor materials mentioned above for the handle substrate 10L. In one embodiment, the semiconductor material layer 14L is composed of a same semiconductor material as the handle substrate 10L. In one example, the semiconductor material layer 14L and the handle substrate 10L may both be composed of silicon. In another embodiment, the semiconductor material layer 14L is composed of a different semiconductor material than the handle substrate 10L. In one example, the semiconductor material layer 14L may be composed of a silicon germanium alloy or a III-V compound semiconductor and the handle substrate 10L may be composed of silicon. In some embodiments, the semiconductor material layer 14L may be composed of a single semiconductor material. In other embodiments, the semiconductor material layer 14L may be composed of at least two different semiconductor materials stacked one atop the other.

The semiconductor material layer 14L is typically a single crystalline semiconductor material such as, for example, single crystalline silicon. The semiconductor material layer 14L may have one of the crystal orientations mentioned above for the handle substrate 10L. In one embodiment, the crystal orientation of the semiconductor material layer 14L and the handle substrate 10L are the same. In another embodiment, the crystal orientation of the semiconductor material layer 14L differs from the handle substrate 10L. The semiconductor material layer 14L may have a thickness from 20 nm to 200 nm. Other thicknesses that are lesser than, or greater than, the aforementioned thickness range may also be employed as the thickness of the semiconductor material layer 14L.

The SOI substrate (10L, 12L, 14L) may be formed by wafer bonding. In yet another embodiment, the SOI substrate (10L, 12L, 14L) may be formed by an implantation process known as SIMOX (i.e., Separation by IMplanting OXygen). In some embodiments of the present application, a thermal mixing process or a thermal condensation process may be employed in forming a silicon germanium alloy as the semiconductor material layer 14L. Thermal mixing includes annealing in an inert ambient (i.e., helium and/or argon), while thermal condensation includes annealing in an oxidizing ambient (air, oxygen, ozone and/or $NO_2$). The anneal temperature for both thermal mixing and thermal condensation can be from 600° C. to 1200° C. In such a process, a sacrificial silicon germanium alloy layer having an initial germanium content can be formed on a silicon layer that is located atop the sacrificial insulator layer. One of thermal mixing or thermal condensation can then be performed to convert the Si/SiGe material stack into a silicon germanium alloy layer having the first germanium content that differs from the initial germanium content.

Figure 2A:
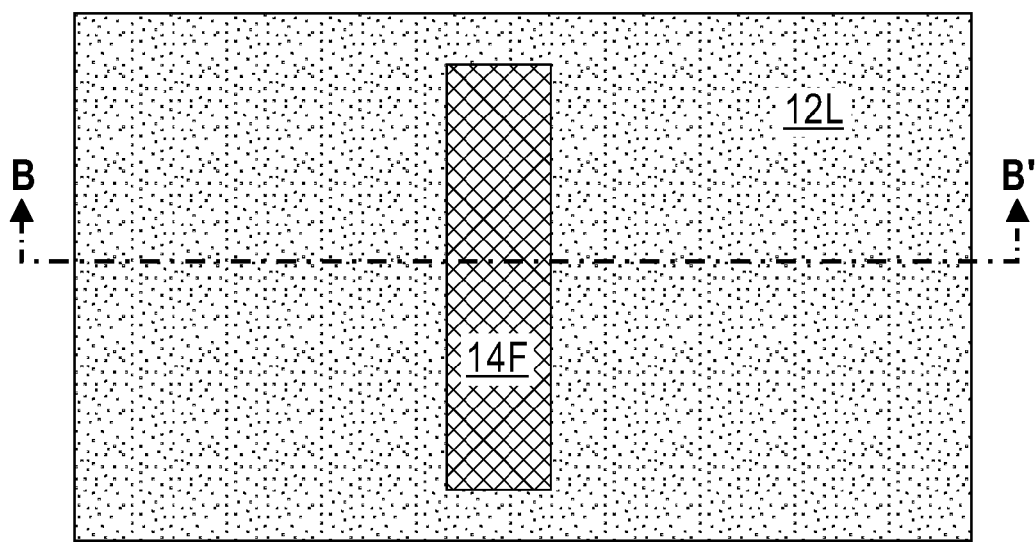
FIG. 2A is a cross sectional view of the exemplary semiconductor structure of FIGS. 1A-1B after patterning the semiconductor material layer to form at least one semiconductor fin.
Figure 2B:
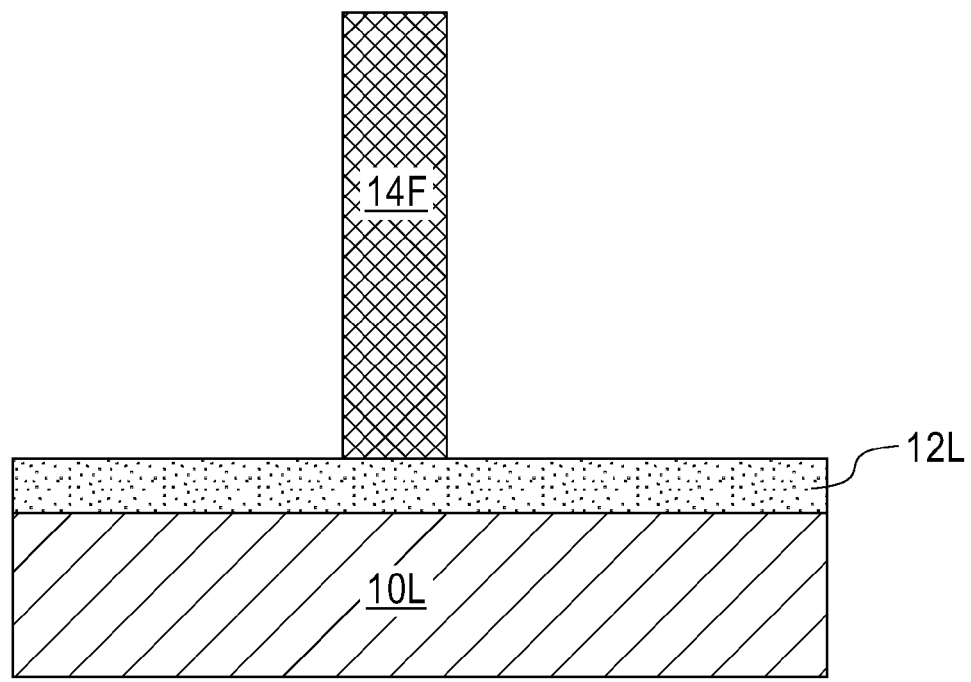
FIG. 2B is a cross sectional view of the exemplary semiconductor structure of FIG. 2A along vertical plane B-B'.

Referring now to FIGS. 2A-2B, there is illustrated the exemplary semiconductor structure of FIGS. 1A-1B after patterning the semiconductor material layer 14L to form at least one semiconductor fin 14F. Although a single semiconductor fin 14F is described and illustrated, a plurality of semiconductor fins 14F can be formed. In the illustrated embodiment, the at least one semiconductor fin 14F extends upward from a topmost surface of the insulator layer 12L. When a bulk semiconductor substrate is used, a topmost surface of the bulk semiconductor substrate would be patterned, and the resultant semiconductor fin would extend upwards from a remaining portion of the bulk semiconductor substrate.

In one embodiment of the present application, the patterning used to provide the at least one semiconductor fin 14F may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. In the illustrated embodiment, the etch stops on the topmost surface of the insulator layer 12L.

In another embodiment of the present application, the patterning used to provide the at least one semiconductor fin 14F may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer on each sidewall of each mandrel structure. The spacer can be formed by deposition of a spacer material and then etching the deposited spacer material. The spacer material may comprise any material having an etch selectivity that differs from the mandrel material. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. The etch stops on a topmost surface of the insulator layer 12L. Upon completion of the pattern transfer, the SIT process concludes by removing the spacers from the structure. Each spacer may be removed by etching or a planarization process.

As used herein, a "semiconductor fin" refers to semiconductor material portion that includes a pair of vertical sidewalls that are parallel to each other. As used herein, a surface is "vertical" if there exists a vertical plane from which the surface does not deviate by more than three times the root mean square roughness of the surface. In one embodiment of the present application, each semiconductor fin 14F has a width from 5 nm to 30 nm. Other widths that are lesser than, or greater than, the range mentioned herein can also be used in the present application. In one embodiment of the present application, the height of each semiconductor fin 14F is determined by the thickness of the semiconductor material layer 14L. When more than one semiconductor fin 14F is formed, each semiconductor fin 14F is spaced apart from its nearest neighboring semiconductor fin 14F by a pitch of from 20 nm to 100 nm. Also, and when multiple semiconductor fins 14F are formed, each semiconductor fin 14F is oriented parallel to each other.

Figure 3A:
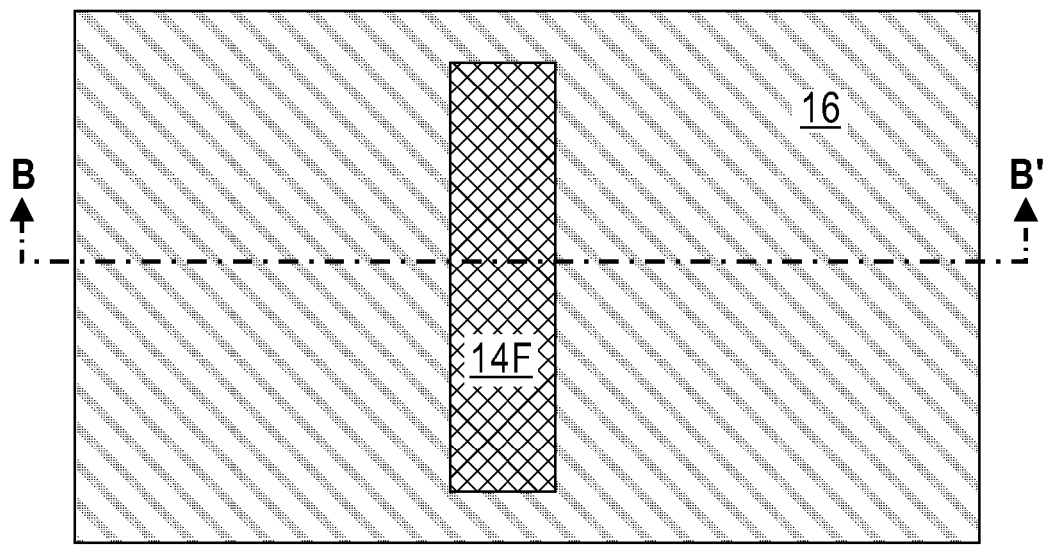
FIG. 3A is a cross sectional view of the exemplary semiconductor structure of FIGS. 2A-2B after forming a local isolation structure at a footprint of the at least one semiconductor fin.
Figure 3B:
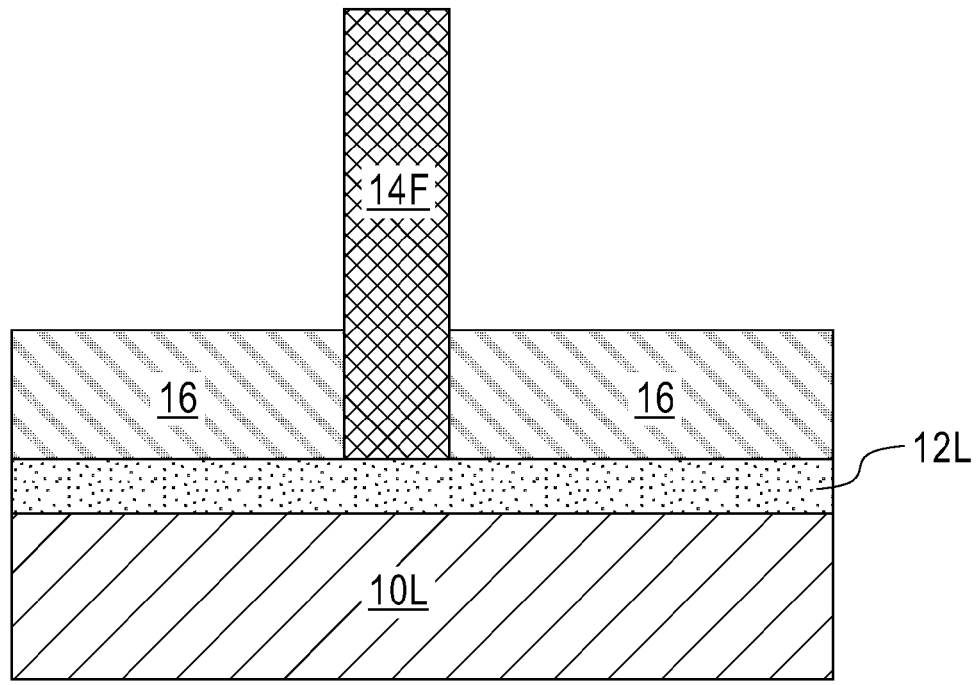
FIG. 3B is a cross sectional view of the exemplary semiconductor structure of FIG. 3A along vertical plane B-B'.

Referring now to FIGS. 3A-3B, there is illustrated the exemplary semiconductor structure of FIGS. 2A-2B after forming a local isolation structure 16 at a footprint of the at least one semiconductor fin 14F. The local isolation structure 16 includes a trench dielectric material that can be formed utilizing a deposition process such as, for example, chemical vapor deposition or plasma enhanced chemical vapor deposition. An example of a trench dielectric material that can be used in the present application in providing the local isolation structure 16 is silicon dioxide. In some embodiments of the present application, an etch back process can follow the deposition of the trench dielectric material.

In the illustrated embodiment, the local isolation structure 16 has a bottommost surface that contacts a topmost surface of the insulator layer 12L. The height of the local isolation structure 16 is less than the height of each semiconductor fin 14F. In one example, the height of the local isolation structure 16 is from 10 nm to 25 nm.

Figure 4A:
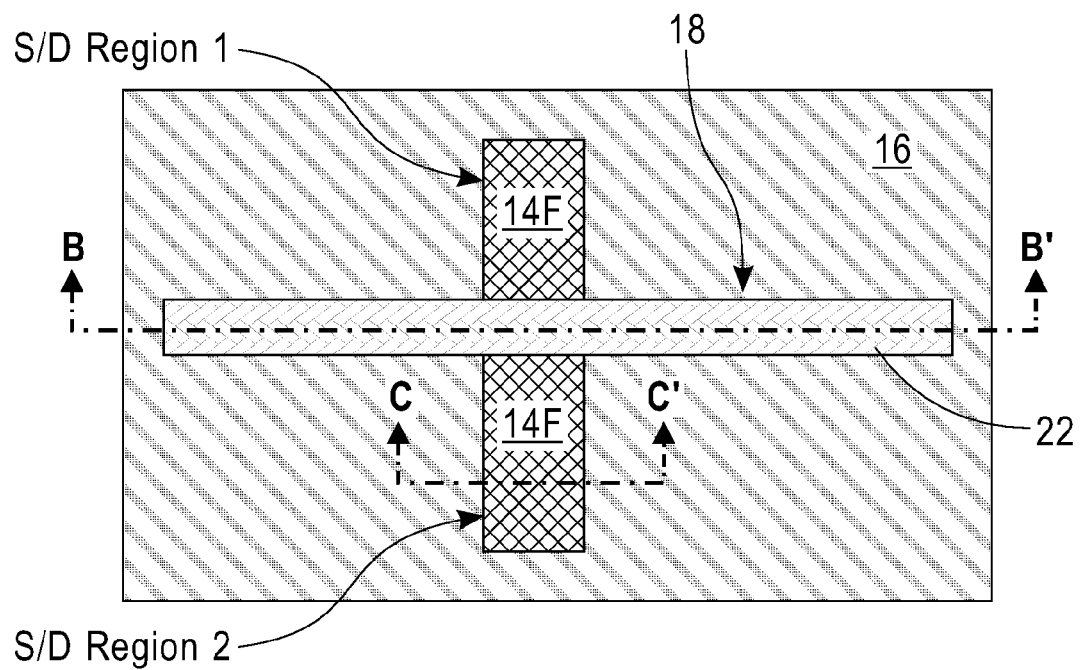
FIG. 4A is a cross sectional view of the exemplary semiconductor structure of FIGS. 3A-3B after forming a gate structure straddling over a portion of the at least one semiconductor fin.
Figure 4B:
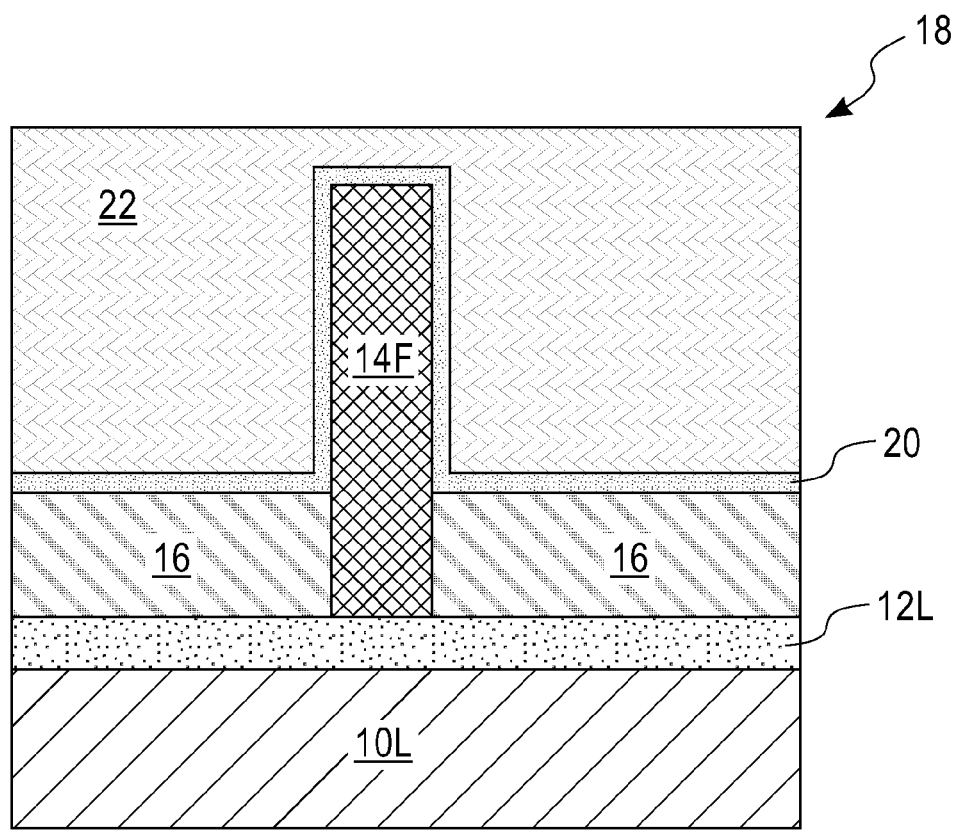
FIG. 4B is a cross sectional view of the exemplary semiconductor structure of FIG. 4A along vertical plane B-B'.
Figure 4C:
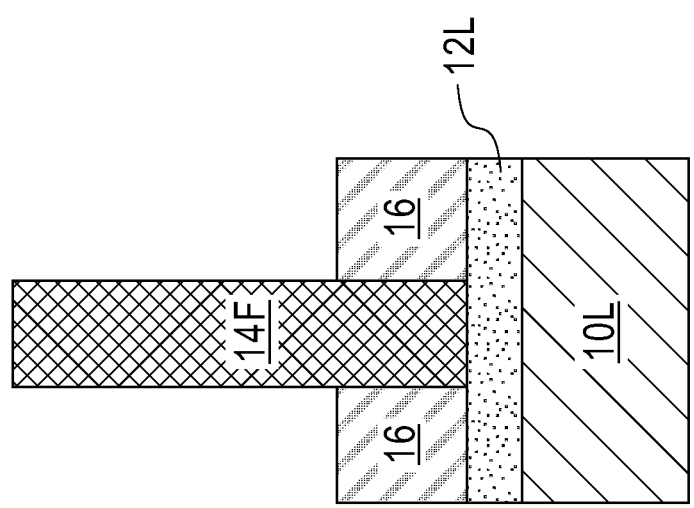
FIG. 4C is a cross sectional view of the exemplary semiconductor structure of FIG. 4A along vertical plane C-C' and with a source region or a drain region.

Referring now to FIGS. 4A-4C, there is illustrated the exemplary semiconductor structure of FIGS. 3A-3B after forming a gate structure 18 straddling over a portion of the at least one semiconductor fin 14F. Prior to forming the gate structure, a portion of the semiconductor fin 14F can be cut utilizing any conventional fin cut process. FIG. 4C is a cross sectional view through S/D Region 2 (i.e., one of the source region or the drain region); the other S/D region (i.e., S/D Region 1) is located on the other side of the gate structure 18. S/D Region 1 would look similar to S/D Region 2 so only one of the S/D regions is shown. For clarity, the gate structure, which would be present in the background of the view shown in FIG. 4C, has been omitted.

Although the present application describes and illustrates a single gate structure 18 being formed, a plurality of gate structures can be formed each straddling over a different portion of each semiconductor fin 14F. Each gate structure lies perpendicular to each semiconductor fin 14F. By "straddling over" it is meant that a first portion of the gate structure 18 is located on one side of the semiconductor fin 14F and a second portion of the gate structure 18 is located on another side of the semiconductor fin 14F; a third portion of the gate structure 18 that lies directly above the semiconductor fin 14F connects the first portion with the second portion.

In one embodiment, the gate structure 18 is a functional gate structures. By "functional gate structure" it is meant a permanent gate structure used to control output current (i.e., flow of carriers in the channel) of a semiconducting device through electrical or magnetic fields. In an embodiment, the gate structure 18 may include a gate dielectric portion 20 and gate conductor portion 22. An optional gate cap portion (not shown) can be located atop the gate conductor portion 22.

The gate dielectric portion 20 may include a gate dielectric material. The gate dielectric material that provides the gate dielectric portion 20 can be an oxide, nitride, and/or oxynitride. In one example, the gate dielectric material that provides the gate dielectric portion 20 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric portion 20. When multiple gate structures are employed a first set of gate structures may include a first gate dielectric portion which may be the same as, or different from, a second gate dielectric portion of a second set of gate structures.

The gate dielectric material used in providing the gate dielectric portion 20 can be formed by any deposition process including, for example, chemical vapor deposition (CVD), plasma enhanced chemical vapor deposition (PECVD), physical vapor deposition (PVD), sputtering, or atomic layer deposition. In some embodiments and when different gate dielectric materials are used in providing the gate dielectric portions, block mask technology can be used. In one embodiment of the present application, the gate dielectric material used in providing the gate dielectric portion 20 can have a thickness in a range from 1 nm to 10 nm. Other thicknesses that are lesser than, or greater than, the aforementioned thickness range can also be employed for the gate dielectric material that may provide the gate dielectric portion 20.

The gate conductor portion 22 can include a gate conductor material. The gate conductor material used in providing the gate conductor portion 22 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. When multiple functional gate structures are employed, a first set of functional gate structure may contain a first gate conductor portion which may be the same as, or different from, a second gate conductor portion of a second set of functional gate structures. In one example, the first gate conductor portion may comprise an nFET gate metal, while the second gate conductor portion may comprise a pFET gate metal.

The gate conductor material used in providing the gate conductor portion 22 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portion of multiple functional gate structures, block mask technology can be used. In one embodiment, the gate conductor material used in providing the gate conductor portion 22 has a thickness from 50 nm to 200 nm. Other thicknesses that are lesser than, or greater than, the aforementioned thickness range can also be employed for the gate conductor material used in providing the gate conductor portion 22.

If present, gate cap portion of each functional gate structure may include a gate cap material. The gate cap material that provides the gate cap portion may include a hard mask material such as, for example, silicon dioxide, silicon nitride, and/or silicon oxynitride. When multiple functional gate structures are employed, the hard mask material that provides the gate cap portion located atop a gate conductor portion of a first set of functional gate structures may be the same as, or different from, the hard mask material that provides the gate gap portion atop a gate conductor portion of a second set of functional gate structures. The hard mask material that provides the gate cap portion can be formed utilizing a conventional deposition process such as, for example, chemical vapor deposition or plasma enhanced chemical vapor deposition. The material that provides the gate cap portion can have a thickness from 5 nm to 20 nm. Other thicknesses that are lesser than, or greater than, the aforementioned thickness range can also be employed as the thickness of the material that provides the gate cap portion.

Each functional gate structure can be formed by providing a functional gate material stack of, from bottom to top, the gate dielectric material, the gate conductor material and, if present, the gate cap material. A patterning process (such as lithography and etching) may follow the formation of the functional gate material stack. Block mask technology may be used to selectively provide one of the functional gate structures prior to forming the other functional gate structure.

Next, a gate spacer (not shown) can be formed along sidewall surfaces of each gate structure. The gate spacer may include any gate dielectric spacer material such as, for example, silicon dioxide and/or silicon nitride. The gate spacer can be formed by deposition of a gate dielectric spacer material and thereafter etching the deposited gate dielectric spacer material.

In other embodiments of the present application, and prior to forming the functional gate structure, a sacrificial gate structure is formed instead. In yet other embodiments, at least one gate structure is a functional gate structure, and one other gate structures is a sacrificial gate structure. By "sacrificial gate structure" it is meant a material or material stack that serves as a placeholder for a subsequently formed functional gate structure. In such a process, the functional gate structure is formed after the source/drain regions have been formed. In such an embodiment, the gate dielectric portion of the functional gate structure that replaces the sacrificial gate structure may be U-shaped. By "U-shaped" it is meant a material that includes a bottom horizontal surface and a sidewall surface that extends upward from the bottom horizontal surface. When employed, each sacrificial gate structure may include a sacrificial gate dielectric portion, a sacrificial gate material portion and a sacrificial gate cap portion. In some embodiments, each sacrificial gate dielectric portion and/or each sacrificial gate cap portion may be omitted. Each sacrificial gate dielectric portion includes one of the dielectric materials mentioned above for gate dielectric portion. Each sacrificial gate material portion includes one of the gate conductor materials mentioned above for the gate conductor portion. The sacrificial gate cap portion includes one of the gate cap materials mentioned above for the gate cap portion. The sacrificial gate structure can be formed by deposition of the various material layers and then patterning the resultant sacrificial dielectric material sack by utilizing, for example, lithography and etching. Next, gate spacers as mentioned above, and after formation of the source/drain regions, the sacrificial gate structure may be replaced with a functional gate structure as described above.

Reference is now made to FIGS. 5-15 which illustrates one embodiment of the present application. In the embodiment depicted in FIGS. 5-15, a bottom-up approach of forming a multi-faceted epitaxial semiconductor structure 32S (See, FIG. 15) within both the source region and the drain region (i.e., S/D Region 1 and S/D Region 2) and on exposed surfaces of semiconductor fin 14F is disclosed. In the bottom-up approach, faceted epitaxial semiconductor material portions (e.g., 32L, 32M, 32U) of the multi-faceted epitaxial semiconductor structure 32S are formed on an exposed portion of each vertical sidewall of the semiconductor fin 14F from a bottom portion of each vertical sidewalls of the semiconductor fin 14F upwards to a top portion of each vertical sidewall of the semiconductor fin 14F. Each faceted epitaxial semiconductor material portion (e.g., 32L, 32M, 32U) of the multi-faceted epitaxial semiconductor structure 32S is stacked one above the other; base portions of each faceted epitaxial semiconductor material portion (e.g., 32L, 32M, 32U) of the multi-faceted epitaxial semiconductor structure 32S that are formed along the exposed portions of each vertical sidewall of the semiconductor fin 14F contact each other. In the bottom-up approach, a topmost faceted epitaxial semiconductor material portion 32T of the multi-faceted epitaxial semiconductor structure 32S is formed on the exposed topmost horizontal surface of the semiconductor fin 14F. The base of the topmost faceted epitaxial semiconductor material portion 32T contacts a base of the uppermost faceted epitaxial semiconductor material portion (e.g., 32U) that is present along the vertical sidewalls of the semiconductor fin 14F.

Each faceted epitaxial semiconductor material portions (e.g., 32L, 32M, 32U, 32T) has a faceted surface that is a crystallographic facet of a single crystalline semiconductor material and is non-planar horizontal and non-vertical. In other words, the angle between a plane including a faceted surface of each faceted epitaxial semiconductor material portion (e.g., 32L, 32M, 32U, 32T) and a vertical line is greater than 0 degree and is less than 90 degree. In one embodiment, each faceted epitaxial semiconductor material portion (e.g., 32L, 32M, 32U, 32T) is triangularly shaped with a base located on a surface (vertical sidewall or topmost) and a tip which extends outwards from the base.

The multi-faceted epitaxial semiconductor structure 32S that is provided may include any number of faceted epitaxial semiconductor material portions (e.g., 32L, 32M, 32U) along the vertical sidewalls of the semiconductor fin 14F. In the illustrated embodiment to follow, the multi-faceted epitaxial semiconductor structure 32S contains three faceted epitaxial semiconductor material portions (e.g., 32L, 32M, 32U) along the vertical sidewalls of the semiconductor fin 14F. Notably, and in the illustrated embodiment, the multi-faceted epitaxial semiconductor structure 32S includes a lower (or bottommost) faceted epitaxial semiconductor material portion 32L, a middle faceted epitaxial semiconductor material portion 32M, an upper faceted epitaxial semiconductor material portion 32U present along the vertical sidewalls of the semiconductor fin 14F and within S/D Region 1 and S/D Region 2; a topmost faceted epitaxial semiconductor material portion 32T is located on the topmost horizontal surface of the semiconductor fin 14F within S/D Region 1 and S/D Region 2. The terms "topmost horizontal surface" and "topmost surface" are interchangeably used in the present application.

The multi-faceted epitaxial semiconductor structure 32S, which is employed as a S/D structure, of the present application has an increased surface area as compared with a conventional faceted epitaxial semiconductor material that does include the multi-faceted design of the present application. This increased surface area means an increased area for subsequent contact formation which, in turn, provides improved contact resistance.

Each faceted epitaxial semiconductor material portion (e.g., 32L, 32M, 32U, 32T) can be formed utilizing a selective epitaxial growth (or deposition process). The term "selective" when used in conjugation with the phrase "selective epitaxial growth" denotes that the epitaxial material is grown only on semiconductor material surfaces not insulator or conductor surfaces. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In the present application, each faceted epitaxial semiconductor material portion (e.g., 32L, 32M, 32U, 32T) is epitaxially aligned with the surface of the semiconductor fin 14F that it is formed. That is, each faceted epitaxial semiconductor material portion (e.g., 32L, 32M, 32U, 32T) has a same crystalline characteristic as a surface of the semiconductor fin 14F in which the particularly faceted epitaxial semiconductor material portion is formed. In one embodiment, each faceted epitaxial semiconductor material portion (e.g., 32L, 32M, 32U, 32T) is a (111) faceted epitaxial semiconductor material.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of each faceted epitaxial semiconductor material portion (e.g., 32L, 32M, 32U, 32T) can be performed utilizing any well known precursor gas or gas mixture including for example, a silicon containing precursor gas (such as silane) and/or a germanium containing precursor gas (such as a germane). Carrier gases like hydrogen, nitrogen, helium and argon can be used. A dopant source is typically added to the precursor gas or precursor gas mixture.

Each faceted epitaxial semiconductor material portion (e.g., 32L, 32M, 32U, 32T) comprises an epitaxial semiconductor material that is doped. The epitaxial semiconductor material that provides each faceted epitaxial semiconductor material portion (e.g., 32L, 32M, 32U, 32T) may include one of the semiconductor materials mentioned above for the semiconductor material layer 14L that provides the semiconductor fin 14F. In one example, silicon or a silicon germanium alloy may be used as the epitaxial semiconductor material of each faceted epitaxial semiconductor material portion (e.g., 32L, 32M, 32U, 32T). In one embodiment, each faceted epitaxial semiconductor material portion (e.g., 32L, 32M, 32U, 32T) comprises a same semiconductor material as the semiconductor fin 14F. In another embodiment, faceted epitaxial semiconductor material portion (e.g., 32L, 32M, 32U, 32T) comprises a different semiconductor material than the semiconductor fin 14F. In yet another embodiment, at least one of faceted epitaxial semiconductor material portions (e.g., 32L, 32M, 32U, 32T) comprises a different semiconductor material than the semiconductor fin 14F.

In some embodiments, each faceted epitaxial semiconductor material portion (e.g., 32L, 32M, 32U, 32T) may comprise a same semiconductor material. Thus, the resultant multi-faceted epitaxial semiconductor structure 32 is composed entirely of one semiconductor material. In other embodiments, at least one of faceted epitaxial semiconductor material portions (e.g., 32L, 32M, 32U, 32T) is composed of a different semiconductor material than the other faceted epitaxial semiconductor material portions (e.g., 32L, 32M, 32U, 32T) that provide the multi-faceted epitaxial semiconductor structure 32.

The dopant that can be present in each faceted epitaxial semiconductor material portion (e.g., 32L, 32M, 32U, 32T) may be n-type dopant or p-type dopant. The dopant is typically introduced into the precursor gas during the epitaxial growth process. In other embodiments, the dopant can be introduced after the epitaxial growth process. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. Each faceted epitaxial semiconductor material portion (e.g., 32L, 32M, 32U, 32T) has a dopant concentration that can be within a range from $2\times10^{20}$ atoms/cm$^3$ to $1\times10^{21}$ atoms/cm$^3$. In some embodiments of the present application, the multi-faceted epitaxial semiconductor structure 32 may have a continuous dopant concentration throughout the entirety of the structure. In other embodiments of the present application, the multi-faceted epitaxial semiconductor structure 32 may contain a graded dopant concentration.

Figure 5:
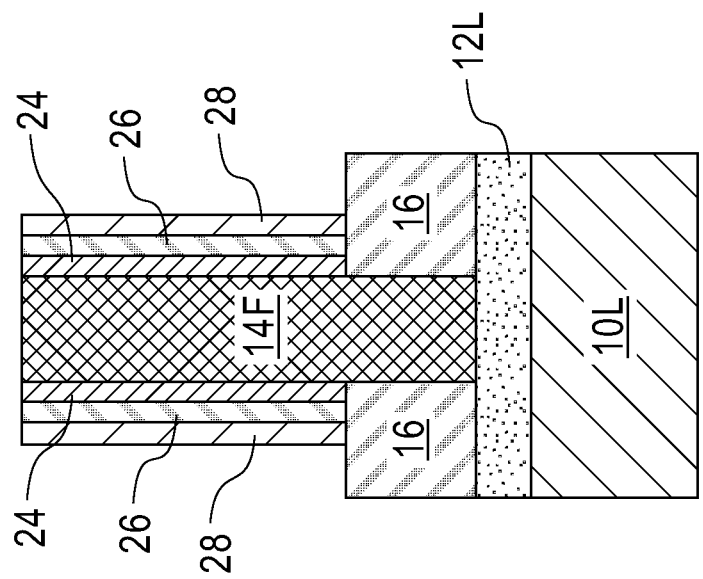
FIG. 5 is a cross sectional view of the exemplary semiconductor structure of FIG. 4C after forming a multilayered spacer structure on each exposed vertical sidewall of the at least one semiconductor fin, wherein each spacer layer of the multilayered spacer structure includes a different spacer material in accordance with one embodiment of the present application.

Referring now to FIG. 5, there is illustrated the exemplary semiconductor structure of FIG. 4C after forming a multi-layered spacer structure on each exposed sidewall of the at least one semiconductor fin 14F, wherein each spacer layer (e.g., 24, 26, 28) of the multilayered spacer structure includes a different spacer material in accordance with one embodiment of the present application. In the illustrated example, the multilayered spacer structure includes a first spacer layer 24 of a first dielectric material, a second spacer layer 26 of a second dielectric material, and a third spacer layer 28 of a third dielectric material, wherein the first dielectric material, the second dielectric material and the third dielectric material each comprise a different dielectric material. Although the present application describes and illustrates a multilayered spacer structure including three spacer layers (24, 26, 28), the present application can use a multilayered spacer structure containing as few as two spacer layers or more than three spacer layers.

In the embodiment illustrated, the first spacer layer 24 has a first sidewall surface that contacts a vertical sidewall surface of the semiconductor fin 14F. The first spacer layer 24 has a bottommost surface that contacts a portion of a topmost surface of the local isolation structure 16, and a topmost surface that is coplanar with a topmost horizontal surface of the semiconductor fin 14F. The first spacer layer 24 includes a first dielectric material that may include a dielectric oxide including a semiconductor oxide or a metal oxide, a dielectric nitride or a dielectric oxynitride. In one example, silicon dioxide is used as the first dielectric material that provides the first spacer layer 24. The first spacer layer 24 may be formed by deposition of the first dielectric material, followed by performing a spacer etch such as, for example, reactive ion etching. The first spacer layer 24 may have a thickness from 1 nm to 10 nm; although other thicknesses that are lesser than, or greater than, the aforementioned thickness range may also be used as the thickness of the first spacer layer 24.

The second spacer layer 26 has a first sidewall that contacts a second sidewall of the first spacer layer 24. The second spacer layer 26 has a bottommost surface that contacts another portion of the topmost surface of the local isolation structure 16, and a topmost surface that is coplanar with a topmost horizontal surface of the semiconductor fin 14F and the first spacer layer 24. The second spacer layer 26 includes a second dielectric material that differs from the first spacer material and may be selected from a dielectric oxide including a semiconductor oxide or a metal oxide, a dielectric nitride or a dielectric oxynitride. In one example, silicon nitride is used as the second dielectric material that provides the second spacer layer 26. The second spacer layer 26 may be formed by deposition of the second dielectric material, followed by performing a spacer etch such as, for example, reactive ion etching. The second spacer layer 26 may have a thickness from 1 nm to 10 nm; although other thicknesses that are lesser than, or greater than, the aforementioned thickness range may also be used as the thickness of the second spacer layer 26. The second spacer layer 26 may have a thickness than is equal to, lesser than, or greater than, the thickness of the first spacer layer 24.

The third spacer layer 28 has a first sidewall that contacts a second sidewall of the second spacer layer 26. The third spacer layer 26 has a bottommost surface that contacts yet another portion of the topmost surface of the local isolation structure 16, and a topmost surface that is coplanar with a topmost horizontal surface of the semiconductor fin 14F, the first spacer layer 24 and the second spacer layer 26. The third pacer layer 28 includes a third dielectric material that differs from the first spacer material and the second dielectric and may be selected from a dielectric oxide including a semiconductor oxide or a metal oxide, a dielectric nitride or a dielectric oxynitride. In one example, a metal oxide such as, for example hafnium dioxide is used as the third dielectric material that provides the third spacer layer 28. The third spacer layer 28 may be formed by deposition of the third dielectric material, followed by performing a spacer etch such as, for example, reactive ion etching. The third spacer layer 28 may have a thickness from 1 nm to 10 nm; although other thicknesses that are lesser than, or greater than, the aforementioned thickness range may also be used as the thickness of the third spacer layer 28. The third spacer layer 28 may have a thickness than is equal to, lesser than, or greater than, the thickness of the first spacer layer 24 and/or the second spacer 26.

In some embodiments, the multilayered spacer structure may be formed by first depositing the various dielectric materials, and then performing a single spacer etch. In the present application, each dielectric material of the multilayered spacer structure is composed of a different dielectric material to provide different etch rates amongst the various spacer layers.

Referring now to FIG. 6, there is illustrated the exemplary semiconductor structure of FIG. 5 after forming a topmost precursor faceted epitaxial semiconductor material portion 32 on the exposed topmost horizontal surface of the at least one semiconductor fin 14F. The topmost precursor faceted epitaxial semiconductor material portion 32 is used in the present application as a cap and during formation of the various faceted epitaxial semiconductor material portions (e.g., 32L, 32M, 32U) along the vertical sidewalls of the at least one semiconductor fin 14F, the topmost precursor faceted epitaxial semiconductor material portion 32 is converted into the topmost faceted epitaxial semiconductor material portion 32T mentioned above.

The topmost precursor faceted epitaxial semiconductor material portion 32 is formed by a selective epitaxial growth process as mentioned above. The topmost precursor faceted epitaxial semiconductor material portion 32 has a height and a width (and thus a dimension) that is greater than a height and a width (and thus a dimension) of the topmost faceted epitaxial semiconductor material portion 32T. As is illustrated, the topmost precursor faceted epitaxial semiconductor material portion 32 covers the entire exposed topmost horizontal surface of the semiconductor fin 14F and covers an entirety of the topmost surface of multilayered spacer structure (e.g., 24, 26, 28).

Referring now to FIG. 7, there is illustrated the exemplary semiconductor structure of FIG. 6 after recessing the local isolation structure 16 to provide a gap 30 beneath the multilayered spacer that exposes a portion of the at least one semiconductor fin 14F. The gap 30 also exposes a bottommost surface of each of the individual spacer layers that constitutes the multilayered spacer structure. In the illustrated embodiment, a bottommost surface of each of the first spacer layer 24, the second spacer layer 26 and the third spacer layer 28 is exposed.

The recessing of the local isolation structure 16 is performed utilizing an etch that selectively removes the trench dielectric material that provides the local isolation structure 16. In one embodiment, dilute hydrofluoric acid may be used to recess the local isolation structure. The local isolation structure 16 that remains after the recessing may be referred to as a local isolation structure portion 16P.

Referring now to FIG. 8, there is illustrated the exemplary semiconductor structure of FIG. 7 after selectively etching the second spacer layer 26 of the multilayered spacer structure relative to the first spacer layer 24 and the third spacer layer 28. This selective etch provides a second spacer layer portion 26P. The second layer portion 26P has a vertical height that is less than the vertical height of the first and third spacer layers 24, 28. In one example, and when the second spacer layer 26 is composed of silicon nitride, hot phosphoric acid may be used to selectively etch the second spacer layer 26. As is shown, the topmost precursor faceted epitaxial semiconductor material portion 32 protects the topmost surface of the multilayered spacer structure from being etched.

Referring now to FIG. 9, there is illustrated the exemplary semiconductor structure of FIG. 8 after selectively etching the first spacer layer 24 of the multilayered spacer structure relative to a remaining portion of the second spacer layer 26 (i.e., second spacer layer portion 26P) and the third spacer layer 28. This selective etch provides a first spacer layer portion 24P. The first layer portion 24P has a vertical height that is less than the vertical height of the second spacer layer portion 26P and the third spacer layer 28. In one example, and when the first spacer layer 24 is composed of silicon dioxide, dilute hydrofluoric acid be used to selectively etch the first spacer layer 26.

Referring now to FIG. 10, there is illustrated the exemplary semiconductor structure of FIG. 9 after selectively etching an entirety of the third spacer layer 28 of the multilayered spacer structure relative to a remaining portion of the first spacer layer 24 (i.e., first spacer layer portion 24P) and the remaining portion of the second spacer layer 26 (i.e., second spacer layer portion 26P). This selective etch exposes a lower portion of each vertical sidewall of the semiconductor fin 14F. In one example, and when the third spacer layer 28 is composed of a metal oxide such as hafnium dioxide, an isotropic etch (such as a reactive ion etch) can be used to selectively and completely etch the third spacer layer 28.

Referring now to FIG. 11, there is illustrated the exemplary semiconductor structure of FIG. 10 after epitaxial growth of a lower faceted epitaxial semiconductor material portion 32L on the exposed lower portion of the vertical sidewall of the at least one semiconductor fin 14F. During this step of the present application, a portion of the topmost precursor faceted epitaxial semiconductor material portion 32 is removed to provide a topmost precursor faceted epitaxial semiconductor material structure portion 32'. In the illustrated embodiment, the topmost precursor faceted epitaxial semiconductor material structure portion 32' is present on the first spacer layer portion 24P, but not the second spacer layer portion 26P. The epitaxial growth of the lower faceted epitaxial semiconductor material portion 32L utilizes the first spacer layer portion 24P and the second spacer layer portion 26P as a mask. The epitaxial growth of the lower faceted epitaxial semiconductor material portion 32L is a selective epitaxial growth process as mentioned above. The semiconductor material and dopant of the lower faceted epitaxial semiconductor material portion 32L have been described above.

Figure 12:
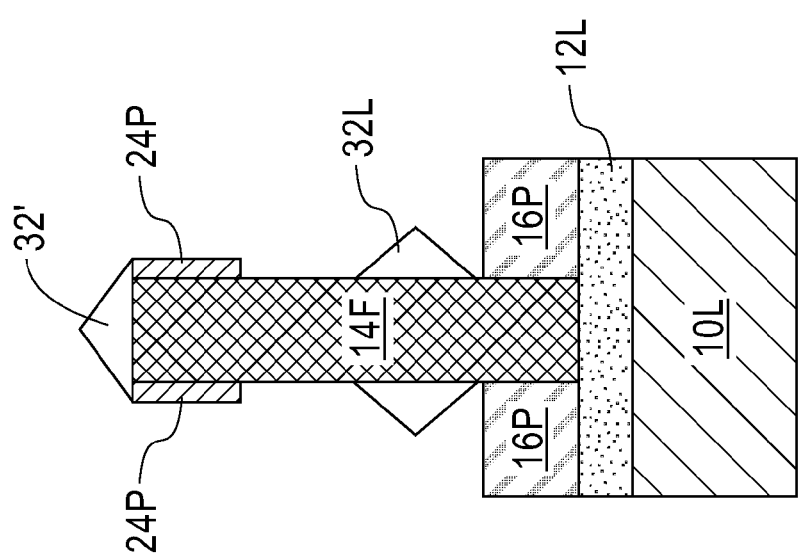
FIG. 12 is a cross sectional view of the exemplary semiconductor structure of FIG. 11 after completely removing the remaining portion of the second spacer layer.

Referring now to FIG. 12, there is illustrated the exemplary semiconductor structure of FIG. 11 after completely removing the remaining portion of the second spacer layer 26 (i.e., the second spacer layer portion 26P). This step exposes a middle portion of each vertical sidewall of the semiconductor fin 14F. The complete removal of the second spacer layer portion 26P may be performed utilizing an isotropic etching process such as, for example, reactive ion etching.

Figure 13:
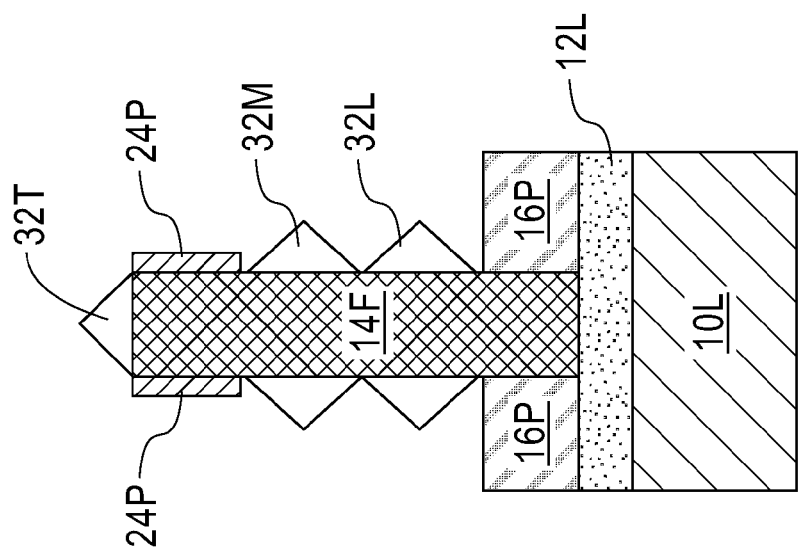
FIG. 13 is a cross sectional view of the exemplary semiconductor structure of FIG. 12 after epitaxial growth of a middle faceted epitaxial semiconductor material portion on an exposed middle portion of each vertical sidewall of the at least one semiconductor fin.

Referring now to FIG. 13, there is illustrated the exemplary semiconductor structure of FIG. 12 after epitaxial growth of a middle faceted epitaxial semiconductor material portion 32M on an exposed middle portion of each vertical sidewall of the at least one semiconductor fin 14P. During this step, the topmost precursor faceted epitaxial semiconductor material structure portion 32' is converted into the topmost faceted epitaxial semiconductor material portion 32T. The epitaxial growth of the middle faceted epitaxial semiconductor material portion 32M utilizes the first spacer layer portion 24P as a mask. The epitaxial growth of the middle faceted epitaxial semiconductor material portion 32M is a selective epitaxial growth process as mentioned above. The semiconductor materials and dopant of the middle faceted epitaxial semiconductor material portion 32M have been described above.

Figure 14:
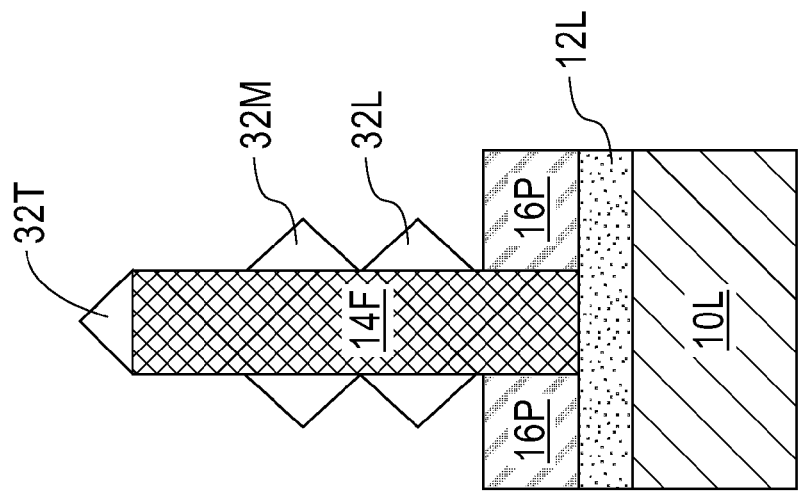
FIG. 14 is a cross sectional view of the exemplary semiconductor structure of FIG. 13 after completely removing the remaining portion of the first spacer layer.

Referring now to FIG. 14, there is illustrated the exemplary semiconductor structure of FIG. 13 after completely removing the remaining portion of the first spacer layer 24 (i.e., the first spacer layer portion 24P). This step exposes an upper portion of each vertical sidewall of the semiconductor fin 14F. The complete removal of the first spacer layer portion 24P may include a wet etch process. In one example, dilute hydrofluoric acid may be used to completely remove the first spacer layer portion 24P from the structure.

Referring now to FIG. 15, there is illustrated the exemplary semiconductor structure of FIG. 14 after epitaxial growth of an upper faceted epitaxial semiconductor material portion 32U on an exposed upper portion of each vertical sidewall of the at least one semiconductor fin 14F. The epitaxial growth of the upper faceted epitaxial semiconductor material portion 32U is a selective epitaxial growth process as mentioned above. The semiconductor materials and dopant of the upper faceted epitaxial semiconductor material portion 32U have been described above.

Referring now to FIG. 16, there is illustrated the exemplary semiconductor structure of FIG. 15 after forming a metal semiconductor alloy layer 34 on exposed surfaces of the multi-faceted epitaxial semiconductor material 32S which includes the lower faceted epitaxial semiconductor material portion 32L, the middle faceted epitaxial semiconductor material portion 32M, the upper faceted epitaxial semiconductor material portion 32U and the topmost faceted epitaxial semiconductor material portion 32U, and a contact metal 36 on the metal semiconductor alloy 34. Prior to forming the metal semiconductor alloy 34 and the contact metal 36, any sacrificial gate structure can be replaced with a functional gate structure. Also, and prior to forming the metal semiconductor alloy 34 and the contact metal 36, a middle-of-the-line (MOL) dielectric material (not shown) such as undoped or doped silicate glass or silicon dioxide is formed and then a contact opening, which houses the metal semiconductor alloy 34 and the contact metal 36, is formed within the MOL dielectric material by lithography and etching.

The metal semiconductor alloy 34 may be formed by first forming a metal semiconductor alloy forming metal (not shown) on the multi-faceted epitaxial semiconductor material 32S. The term "metal semiconductor alloy forming metal" is used throughout the present application to denote a metal that can react with an underlying semiconductor material to form a metal semiconductor alloy. Illustrative examples of metal semiconductor alloy forming metals that can be used in the present application include at least one of nickel (Ni), platinum (Pt), palladium (Pd), titanium (Ti), tungsten (W), and cobalt (Co). The metal semiconductor alloy forming metal can be formed by a deposition process including, for example, chemical vapor deposition, plasma enhanced chemical vapor deposition, plating or sputtering. In some embodiments, a co-deposition of metal semiconductor alloy forming metals can be used. In another embodiment, a first metal semiconductor alloy forming metal can be formed, followed by a second metal semiconductor alloy forming metal. The metal semiconductor alloy metal that is formed can have a thickness from 5 to 15 nm. Other thicknesses that are greater than or lesser than the aforementioned thickness range can also be employed as the thickness of the metal semiconductor alloy forming metal.

After providing the metal semiconductor alloy forming metal and in some embodiments of the present application, a diffusion barrier (not shown) can be formed on an exposed upper surface of the metal semiconductor alloy forming metal. In another embodiment of the present application, no diffusion barrier is provided on the exposed upper surface of the metal semiconductor alloy forming metal. When present, the diffusion barrier can include a metal nitride such as, for example, TiN or TaN, and any deposition process including those mentioned above for providing the metal semiconductor alloy forming metal may be used. When present, the diffusion barrier can have a thickness from 1 nm to 20 nm. Next, an anneal is performed under conditions that are effective in causing the metal semiconductor alloy forming metal to diffuse into a underlying surface portion of the multi-faceted epitaxial semiconductor material 32S forming the metal semiconductor alloy 34. In one embodiment, metal semiconductor alloy 34 includes a metal silicide such as, for example, nickel silicide or platinum-nickel silicide. In another embodiment, the metal semiconductor alloy 34 includes a metal germanide such as nickel germanide.

The metal semiconductor alloy formation anneal may be performed in a single step or a two-step anneal can be used. In one embodiment and when nickel is used, the metal semiconductor alloy formation anneal can be performed at a temperature of from 200° C. to 500° C. In another embodiment, temperatures greater than 500° C. can be used. The metal semiconductor alloy formation anneal is typically performed in an ambient including, for example, argon, helium, neon and/or nitrogen. The metal semiconductor alloy formation anneal can be performed utilizing a rapid thermal anneal, a spike anneal, a microwave anneal or a laser anneal. Following the metal semiconductor alloy formation anneal, the optional diffusion barrier and any unreacted metal semiconductor alloy forming metal can be removed utilizing one or more etch processes.

After forming the metal semiconductor alloy 34, the contact metal 36 is formed. The contact metal 36 may comprise an elemental metal or an alloy of an elemental metal. In one embodiment, the contact metal 36 may comprises Cu, W, Al or alloys thereof. The contact metal 36 may be formed by a deposition process including the ones mentioned above in forming the gate conductor material, followed by an optional planarization process such as, for example, chemical mechanical polishing (CMP) and/or grinding.

Reference is now made to FIGS. 17-23 which illustrates another embodiment of the present application. In the embodiment depicted in FIGS. 17-23, a top-down approach of forming a multi-faceted epitaxial semiconductor structure 32S (See, FIG. 23) within both the source region and the drain region (i.e., S/D Region 1 and S/D Region 2) and on exposed surfaces of semiconductor fin 14F is disclosed. In the top-down approach, which begins with first providing the exemplary semiconductor structure shown in FIGS. 4A-4C, faceted epitaxial semiconductor material portions (e.g., 32U, 32M, 32U) of the multi-faceted epitaxial semiconductor structure 32S are formed on an exposed portions of each vertical sidewall of the semiconductor fin 14F from a top portion of each vertical sidewall of the semiconductor fin 14 downwards.

Like the previous embodiment, each faceted epitaxial semiconductor material portion (e.g., 32L, 32M, 32U) of the multi-faceted epitaxial semiconductor structure 32S is stacked one above the other; base portions of each faceted epitaxial semiconductor material portion (e.g., 32L, 32M, 32U) of the multi-faceted epitaxial semiconductor structure 32S that are formed along the exposed portions of each vertical sidewall of the semiconductor fin 14F contact each other. In the top-down approach, a topmost faceted epitaxial semiconductor material portion 32T of the multi-faceted epitaxial semiconductor structure 32S is formed on the exposed topmost horizontal surface of the semiconductor fin 14F during the formation of the upper faceted epitaxial semiconductor material portion (i.e., 32U) that is formed at a top portion of each vertical sidewall of the semiconductor fin 14F. The base of the topmost faceted epitaxial semiconductor material portion 32T contacts a base of the uppermost faceted epitaxial semiconductor material portion (e.g., 32U).

Each faceted epitaxial semiconductor material portions (e.g., 32L, 32M, 32U, 32T) and hence the resultant multi-faceted epitaxial semiconductor structure 32 can be formed utilizing the selective epitaxial growth process mentioned above. Each faceted epitaxial semiconductor material portions (e.g., 32L, 32M, 32U, 32T) of this embodiment of the present application includes materials and has the same characteristics as mentioned above in the previous embodiment of the present application.

Referring first to FIG. 17, there is illustrated the exemplary semiconductor structure of FIG. 4C after forming a multilayered liner structure straddling the exposed portion of each vertical sidewall and topmost surface of the at least one semiconductor fin 14F in accordance with an embodiment of the present application. In this embodiment. each liner layer (e.g., 40L, 42L) of the multilayered liner structure includes a different dielectric material.

In the illustrated example, the multilayered liner structure includes a first liner 40L of a first dielectric material, and a second liner 42L of a second dielectric material. Additional liners can be used besides the two specifically described and illustrated herein. In accordance with the present application, the first dielectric material and the second dielectric material each comprise a different dielectric material.

In the embodiment illustrated, the first liner 40L has a first sidewall surface that contacts a vertical sidewall surface of the semiconductor fin 14F; a portion of the first liner 40L also contacts a topmost surface of the semiconductor fin 14F. The first liner 40L includes a first dielectric material that may include a dielectric oxide including a semiconductor oxide or a metal oxide, a dielectric nitride or a dielectric oxynitride. In one example, silicon dioxide is used as the first dielectric material that provides the first liner 40L. The first liner 40L may be formed by deposition of the first dielectric material. The first liner 40L may have a thickness from 1 nm to 10 nm; although other thicknesses that are lesser than, or greater than, the aforementioned thickness range may also be used as the thickness of the first liner 40L.

The second liner 42L contacts an exposed surface of the first liner 40L. The second liner 42L includes a second dielectric material that differs from the first dielectric material and may be selected from a dielectric oxide including a semiconductor oxide or a metal oxide, a dielectric nitride or a dielectric oxynitride. In one example, silicon nitride is used as the second dielectric material that provides the second liner 42L. The second liner 42L may be formed by deposition of the second dielectric material. The second liner 42L may have a thickness from 1 nm to 10 nm; although other thicknesses that are lesser than, or greater than, the aforementioned thickness range may also be used as the thickness of the second liner 42L. The second liner 42L may have a thickness than is equal to, lesser than, or greater than, the thickness of the first liner 40L.

Figure 18:
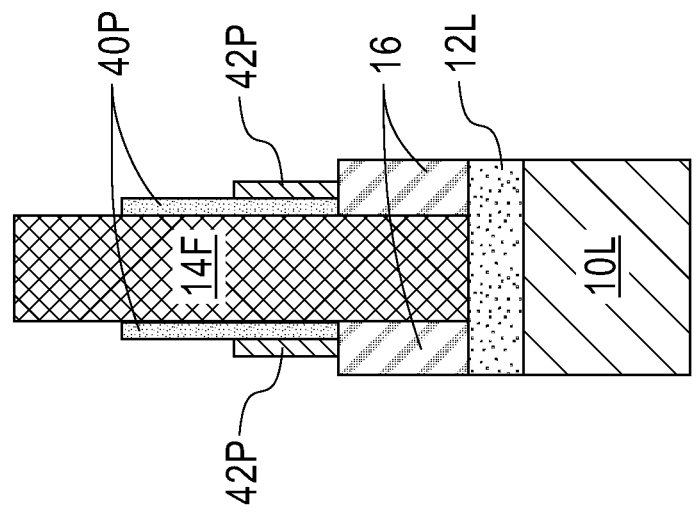
FIG. 18 is a cross sectional view of the exemplary semiconductor structure of FIG. 17 after etching a portion of the multilayered liner structure to expose the topmost horizontal surface and an upper portion of each vertical sidewall of the at least one semiconductor fin.

Referring now to FIG. 18, there is illustrated the exemplary semiconductor structure of FIG. 17 after etching a portion of the multilayered liner structure (e.g., 40L, 42L) to expose a topmost surface and an upper portion of each vertical sidewall of the at least one semiconductor fin 14F. The etching used in this part of the present application is an anisotropic etch such as a reactive ion etch that has a higher etch selectivity for the second liner 42L as compared to the first liner 40L such that the second liner 42L etches at a faster rate than the first liner 40L. The first liner 40L that remains can be referred to as a first liner portion 40P, and the second liner 42L that remains can be referred to as a second liner portion 42P. In one example, the anisotropic etch has a 2:1 etch selectivity for the second liner 42L relative to the first liner 40L. In this step, the vertical height of the first liner portion 40P along the portion of the vertical sidewalls of the semiconductor fin 14F is greater than a vertical height of the second liner portion 42P.

Figure 19:
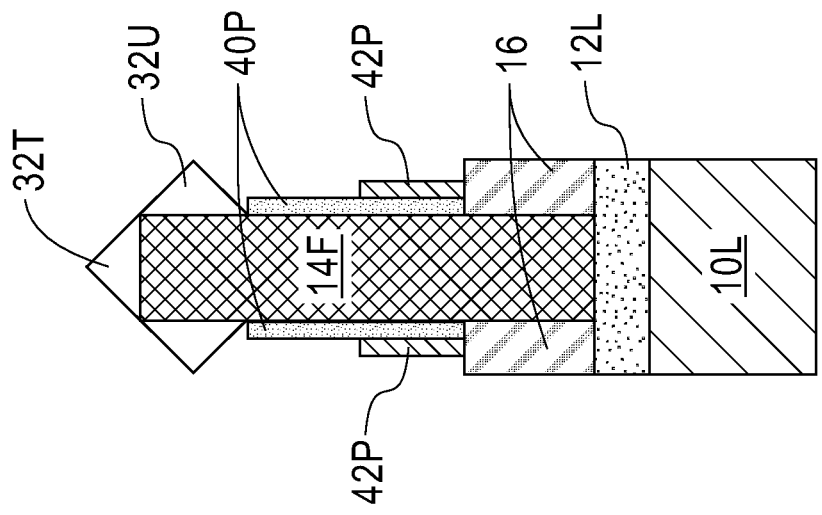
FIG. 19 is a cross sectional view of the exemplary semiconductor structure of FIG. 18 after epitaxially growing an upper faceted epitaxial semiconductor material portion and a topmost faceted epitaxial semiconductor material portion.

Referring now to FIG. 19, there is illustrated the exemplary semiconductor structure of FIG. 18 after epitaxially growing an upper faceted epitaxial semiconductor material portion 32U and a topmost faceted epitaxial semiconductor material portion 32T. Notably, the upper faceted epitaxial semiconductor material portion 32U is formed on an exposed upper portion of each vertical sidewall of the at least one semiconductor fin 14F, while the topmost faceted epitaxial semiconductor material portion 32T is formed on the exposed topmost horizontal surface of each semiconductor fin 14F. The epitaxial growth of the upper faceted epitaxial semiconductor material portion 32U and the topmost faceted epitaxial semiconductor material portion 32T is a selective epitaxial growth process as mentioned above. The semiconductor materials and dopant of the upper faceted epitaxial semiconductor material portion 32U and the topmost faceted epitaxial semiconductor material portion 32T have been described above.

Figure 20:
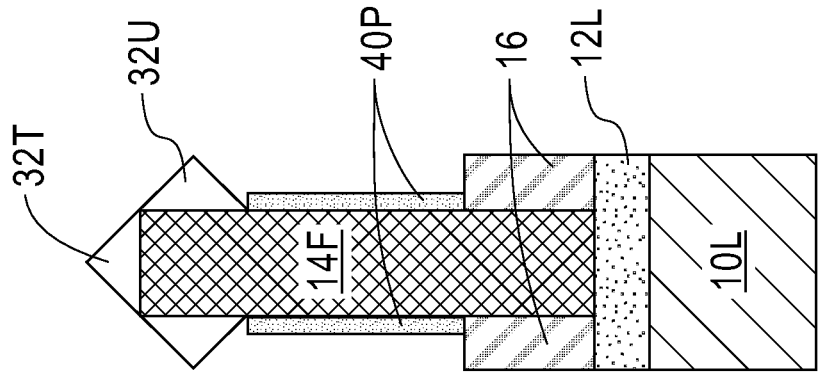
FIG. 20 is a cross sectional view of the exemplary semiconductor structure of FIG. 19 after completely removing a remaining portion of the outermost liner layer of the multilayered liner structure to expose a middle portion of each vertical sidewall of the at least one semiconductor fin.

Referring now to FIG. 20, there is illustrated the exemplary semiconductor structure of FIG. 19 after completely removing a remaining portion of the outermost liner layer of the multilayered liner structure (i.e., the second liner portion 42P) to expose a middle portion of each vertical sidewall of the at least one semiconductor fin 14F. The complete removal of the remaining portion of the outermost liner layer of the multilayered liner structure (i.e., the second liner portion 42P) can be performed utilizing an etch that selectively removes the material the defines the outermost liner layer. In one example, and when the outermost liner layer comprises silicon nitride, hot phosphoric acid can be used.

Figure 21:
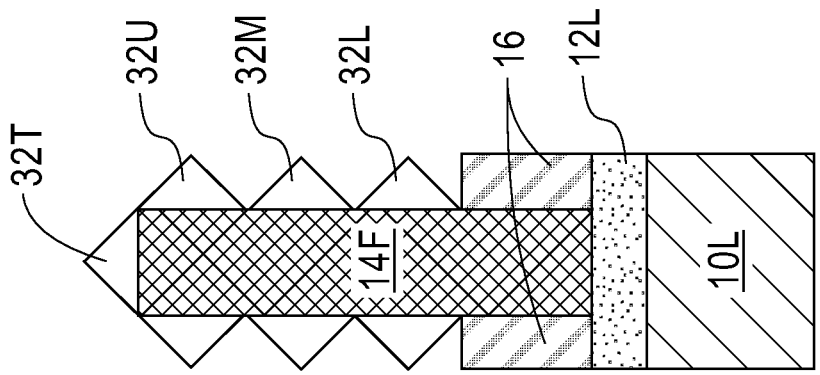
FIG. 21 is a cross sectional view of the exemplary semiconductor structure of FIG. 20 after epitaxially growing a middle faceted epitaxial semiconductor material portion.

Referring now to FIG. 21, there is illustrated the exemplary semiconductor structure of FIG. 20 after epitaxially growing a middle faceted epitaxial semiconductor material portion 32M. Notably, the middle faceted epitaxial semiconductor material portion 32M is formed on an exposed middle portion of each vertical sidewall of the at least one semiconductor fin 14F. The epitaxial growth of the middle faceted epitaxial semiconductor material portion 32M is a selective epitaxial growth process as mentioned above. The semiconductor materials and dopant of the middle faceted epitaxial semiconductor material portion 32M have been described above.

Figure 22:
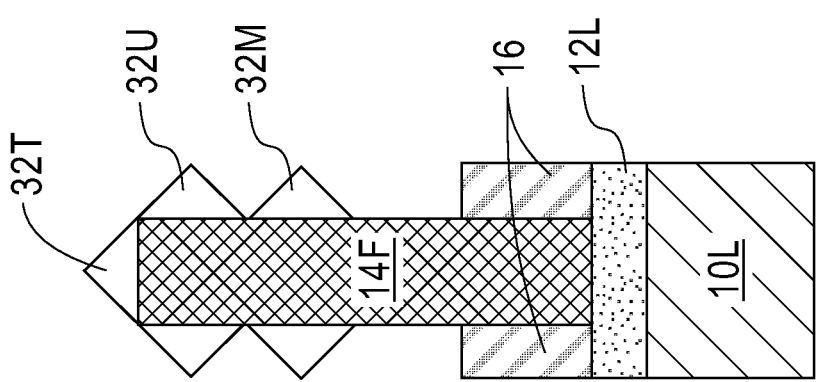
FIG. 22 is a cross sectional view of the exemplary semiconductor structure of FIG. 21 after completely removing a remaining portion of the innermost liner layer of the multilayered liner structure to expose a bottom portion of each vertical sidewall of the at least one semiconductor fin.

Referring now to FIG. 22, there is illustrated the exemplary semiconductor structure of FIG. 21 after completely removing a remaining portion of the innermost liner layer (i.e., the first liner portion 40P of the multilayered liner structure to expose a bottom portion of each vertical sidewall of the at least one semiconductor fin 14F. The removal of the remaining portion of the innermost liner layer (i.e., the first liner portion 40P of the multilayered liner structure may be performed utilizing an etch that is selective for removing the material that provides the remaining portion of the innermost liner layer (i.e., the first liner portion 40P of the multilayered liner structure.

Figure 23:
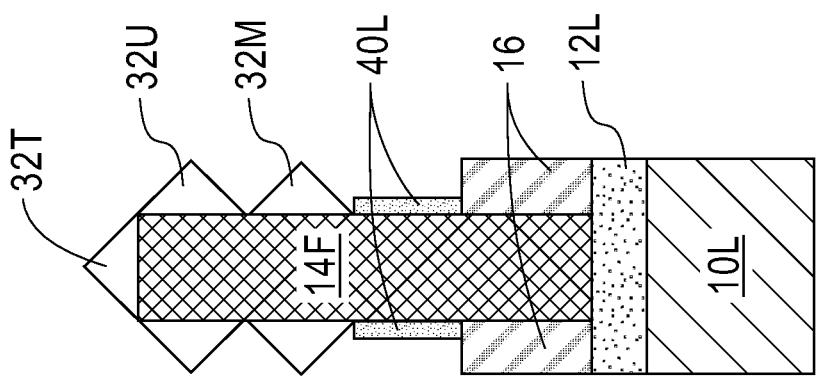
FIG. 23 is a cross sectional view of the exemplary semiconductor structure of FIG. 22 after epitaxially growing a lower faceted epitaxial semiconductor material portion.

Referring now to FIG. 23, there is illustrated the exemplary semiconductor structure of FIG. 22 after epitaxially growing a lower faceted epitaxial semiconductor material portion 32L. Notably, the lower faceted epitaxial semiconductor material portion 32L is formed on an exposed lower portion of each vertical sidewall of the at least one semiconductor fin 14F. The epitaxial growth of the lower faceted epitaxial semiconductor material portion 32L is a selective epitaxial growth process as mentioned above. The semiconductor materials and dopant of the lower faceted epitaxial semiconductor material portion 32L have been described above.

The exemplary semiconductor structure formed by the top-down approach and as illustrated in FIG. 23 is the same as that described above for the bottom-up approach mentioned above and shown in FIG. 15. The exemplary semiconductor structure shown in FIG. 23 can then be processed to provide the exemplary semiconductor structure shown in FIG. 16.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   at least one semiconductor fin extending upwards from a surface of a substrate;
   a functional gate structure straddling over a portion of said at least one semiconductor fin;
   a multi-faceted epitaxial semiconductor structure located on exposed surfaces of said at least one semiconductor fin and on both sides of said gate structure, wherein each multi-faceted epitaxial semiconductor structure includes a plurality of faceted epitaxial semiconductor material portions located on different portions of each vertical sidewall of said at least one semiconductor fin and a topmost faceted epitaxial semiconductor material portion that is located on an exposed topmost horizontal surface of said at least one semiconductor fin; and
   a metal semiconductor alloy located on exposed surfaces of said plurality of faceted epitaxial semiconductor material portions and said topmost faceted epitaxial semiconductor material portion.

2. The semiconductor structure of claim 1, wherein said plurality of faceted epitaxial semiconductor material portions comprises, from bottom to top, a lower faceted epitaxial semiconductor material portion, a middle faceted epitaxial semiconductor material portion and an upper faceted epitaxial semiconductor material portion.

3. The semiconductor structure of claim 1, wherein each of said plurality of faceted epitaxial semiconductor material portions and said topmost faceted epitaxial semiconductor material portion comprises a (111) faceted epitaxial semiconductor material that is doped with a n-type or p-type dopant.

4. The semiconductor structure of claim 1, further comprising a contact metal located on said metal semiconductor alloy.

5. The semiconductor structure of claim 1, wherein said at least one semiconductor fin and said multi-faceted epitaxial semiconductor structure comprise a same semiconductor material.

6. The semiconductor structure of claim 1, further comprising a local isolation structure portion at a footprint of said at least one semiconductor fin.

7. The semiconductor structure of claim 1, wherein said substrate is an insulator layer of a semiconductor-on-insulator substrate.

8. The semiconductor structure of claim 1, wherein each of said plurality of faceted epitaxial semiconductor material portions and said topmost faceted epitaxial semiconductor material portion comprises a triangularly shaped epitaxial semiconductor.

9. The semiconductor structure of claim 8, wherein a base of each triangularly shaped epitaxial semiconductor contacts a surface of said at least one semiconductor fin.

10. A method of forming a semiconductor structure, said method comprising:
    forming a gate structure straddling over a portion of at least one semiconductor fin;
    forming a multi-faceted epitaxial semiconductor structure on exposed surfaces of said at least one semiconductor fin and on both sides of said gate structure, wherein each multi-faceted epitaxial semiconductor structure includes a plurality of faceted epitaxial semiconductor material portions located on different portions of each vertical sidewall of said at least one semiconductor fin and a topmost faceted epitaxial semiconductor material portion that is located on an exposed topmost horizontal surface of said at least one semiconductor fin;
    forming a metal semiconductor alloy of exposed surfaces of said multi-faceted epitaxial semiconductor structure; and
    forming a contact metal on said metal semiconductor alloy.

11. The method of claim 10, wherein said forming said multi-faceted epitaxial semiconductor structure comprises:
    forming a local isolation structure at a footprint of said at least one semiconductor fin;
    forming a multilayered spacer structure on each of said vertical sidewalls of said at least one semiconductor fin and on a portion of said location isolation structure;
    forming a topmost precursor faceted epitaxial semiconductor material portion on said exposed topmost horizontal surface of said at least one semiconductor fin and said multilayered spacer structure;
    recessing said local isolation structure to define a gap beneath said multilayered spacer structure;
    selectively etching said multilayered spacer structure to expose a bottom portion of each of said vertical sidewalls of said at least one semiconductor fin;
    epitaxially growing a lower faceted epitaxial semiconductor material portion at said bottom portion of each of said vertical sidewalls of said at least one semiconductor fin; and
    performing, any number of, sequential steps of:
    selectively etching a remaining portion of said multilayer spacer structure to expose another portion of each of said vertical sidewalls of said at least one semiconductor fin, and
    epitaxially growing a faceted epitaxial semiconductor material portion at said another portion of each of said vertical sidewalls of said at least one semiconductor fin in a bottom-up fashion to provide remaining faceted epitaxial semiconductor material portions along each of said vertical sidewalls of said at least one semiconductor fin.

12. The method of claim 11, wherein said multilayered spacer structure contains a plurality of spacer layers, each spacer layer comprising a different dielectric material.

13. The method of claim 10, wherein said forming said multi-faceted epitaxial semiconductor structure comprises:
    forming a local isolation structure at a footprint of said at least one semiconductor fin;
    forming a multilayered liner structure straddling over other portions of said at least one semiconductor fin and on a portion of said location isolation structure;
    selectively etching said multilayered liner structure to expose a topmost surface of said at least one semiconductor fin and an upper portion of each of said vertical sidewalls of said at least one semiconductor fin;
    epitaxially growing an upper faceted epitaxial semiconductor material portion at said upper portion of each of said vertical sidewalls of said at least one semiconductor fin, and said topmost faceted epitaxial semiconductor material portion on said exposed topmost horizontal surface of said at least one semiconductor fin; and performing, any number of, sequential steps of:

selectively etching a remaining portion of said multilayer liner structure to expose another portion of each of said vertical sidewalls of said at least one semiconductor fin, and epitaxially growing a faceted epitaxial semiconductor material portion at said another portion of each of said vertical sidewalls of said at least one semiconductor fin in a top-down fashion to provide remaining faceted epitaxial semiconductor material portions along each of said vertical sidewalls of said at least one semiconductor fin.

14. The method of claim 13, wherein said multilayered liner structure contains a plurality of dielectric liners, each dielectric liner comprising a different dielectric material.

15. The method of claim 10, each of said plurality of faceted epitaxial semiconductor material portions and said topmost faceted epitaxial semiconductor material portion comprises a (111) faceted epitaxial semiconductor material that is doped with a n-type or p-type dopant.

16. The method of claim 10, wherein said plurality of faceted epitaxial semiconductor material portions comprises, from bottom to top, a lower faceted epitaxial semiconductor material portion, a middle faceted epitaxial semiconductor material portion and an upper faceted epitaxial semiconductor material portion.

17. The method of claim 10, wherein said gate structure is a functional gate structure.

18. The method of claim 10, wherein said gate structure is a sacrificial gate structure and said sacrificial gate structure is replaced with a functional gate structure after forming said multi-faceted epitaxial semiconductor structure.

19. A method of forming a semiconductor structure, said method comprising:

forming a gate structure straddling over a portion of at least one semiconductor fin; and forming a multi-faceted epitaxial semiconductor structure on exposed surfaces of said at least one semiconductor fin and on both sides of said gate structure, wherein each multi-faceted epitaxial semiconductor structure includes a plurality of faceted epitaxial semiconductor material portions located on different portions of each vertical sidewall of said at least one semiconductor fin and a topmost faceted epitaxial semiconductor material portion that is located on an exposed topmost horizontal surface of said at least one semiconductor fin, wherein said gate structure is a sacrificial gate structure and said sacrificial gate structure is replaced with a functional gate structure after forming said multi-faceted epitaxial semiconductor structure.

20. The method of claim 19, further comprising:

forming a metal semiconductor alloy of exposed surfaces of said multi-faceted epitaxial semiconductor structure; and forming a contact metal on said metal semiconductor alloy.

* * * * *